United States Patent [19]

Denis et al.

[11] 4,387,445
[45] Jun. 7, 1983

[54] RANDOM ACCESS MEMORY CELL

[75] Inventors: Bernard A. Denis, Mennecy, France; David B. Eardley, Stanfordville, N.Y.

[73] Assignee: International Business Machines Corporation, Armonk, N.Y.

[21] Appl. No.: 237,796

[22] Filed: Feb. 24, 1981

[51] Int. Cl.³ .............................................. G11C 11/40
[52] U.S. Cl. .................................... 365/179; 365/156
[58] Field of Search .................. 365/72, 154, 155, 156, 365/174, 179, 189, 190, 202, 207; 307/238.6; 357/45

[56] References Cited

U.S. PATENT DOCUMENTS

| | | | |
|---|---|---|---|
| 3,535,699 | 10/1970 | Gaensslen et al. | 365/156 |
| 3,643,235 | 2/1972 | Berger et al. | 365/156 |
| 3,781,828 | 12/1973 | Platt et al. | 365/179 |
| 3,815,106 | 6/1974 | Wiedmann | 365/72 |
| 3,909,807 | 9/1975 | Fulton | 365/72 |
| 4,021,786 | 5/1977 | Peterson | 365/156 |
| 4,023,148 | 5/1977 | Heuber et al. | 365/156 |
| 4,032,902 | 6/1977 | Herndon | 365/156 |
| 4,081,697 | 3/1978 | Nakano | 365/154 |
| 4,122,542 | 10/1978 | Camerik et al. | 365/156 |
| 4,144,586 | 3/1979 | Aungs et al. | 365/156 |

OTHER PUBLICATIONS

Farley et al., "Integrated Static SCR Memory Cell", IBM Technical Disclosure Bulletin, vol. 22, No. 1, Jun. 1979, pp. 135-136.
Boudon et al., "Fast-Read Reference Scheme for Multi-Emitter (Harper) Cell", IBM Technical Disclosure Bulletin, vol. 21, No. 4, Sep. 1978, pp. 1476-1478.
Dorler et al., "Lateral PNP Design for Memory Cell", IBM Technical Diclosure Bulletin, vol. 17, No. 6, Nov. 1974, pp. 1619-1620.
Dorler et al., "Complementary Transistor Switch Memory Cell", IBM Technical Disclosure Bulletin, vol. 16, No. 12, May 1974, pp. 3931-3932.
Gaensslen, "Complementary Four Device FET Memory Cell", IBM Technical Disclosure Bulletin, vol. 13, No. 12, May 1971, pp. 3614-3615.
Dorler et al., "AC Write Scheme for Bipolar Random-Access Memories Using Schottky Coupled Cells", IBM Technical Diclosure Bulletin, vol. 23, No. 11, Apr. 1981, pp. 4960-4962.

Primary Examiner—Joseph A. Popek
Attorney, Agent, or Firm—Sughrue, Mion, Zinn, Macpeak and Seas

[57] ABSTRACT

Two memory cells each can be entirely fabricated in only two isolation beds. In one embodiment each bed contains one lateral PNP and one vertical NPN transistor in a merged structure. In a second embodiment, each bed contains one lateral PNP and two vertical NPN transistors in a merged structure. Memory access circuitry provides a high ratio of selected to unselected cell current in order to permit fast memory operation.

9 Claims, 8 Drawing Figures

RANDOM ACCESS MEMORY CELL

BACKGROUND OF THE INVENTION

This invention relates to an information storage device and, more particularly, to an active electronic memory cell of the type having a pair of transistors cross-coupled to form a flip-flop.

Various types of flip-flop memory cells are well known in the art, most utilizing at least six transistors. For example, as described in U.S. Pat. No. 3,815,106 to Wiedmann and U.S. Pat. No. 4,081,697 to Nakano, a memory cell typically includes a pair of cross-coupled NPN transistors with a pair of PNP transistors acting as loads for the NPN flip-flop transistors. A second pair of PNP transistors is then used to couple the flip-flop cell to the bit lines. Although such arrangements are highly useful, it would be desirable to decrease the cell size, increase operating speed and decrease the power requirements of such memory cells.

The quest for a higher performance memory device has led to development of the transistor gated PNP load (TGPL) memory cell shown in FIG. 1 which utilizes only four transistors. This cell utilizes cross-coupled NPN transistors 10 and 12 and a pair of PNP load transistors 14 and 16. In order to read the contents of the cell, a low potential read signal is supplied to line 18 to turn on both of transistors 14 and 16. Alternatively, line 18 could be maintained at a constant potential and a positive pulse applied to the emitters of transistors 14 and 16. Assuming that a "1" is stored in the cell and the NPN transistor 10 is on and transistor 12 is off, the potential at the collector of transistor 10 and base of transistor 12 will be lower than that at the collector of transistor 12 and base of transistor 10. When the two transistors 14 and 16 are simultaneously turned on, this imbalance will show up as a potential difference between the emitters of transistors 10 and 12 which are coupled to bit lines 20 and 22, respectively, and a sense amplifier will determine the contents of the memory cell by detecting this potential difference.

Although the cell illustrated in FIG. 1 achieves improvements in both cell size and performance over prior art cells taught in the above-mentioned U.S. patents, it would still be desirable to achieve further improvements in these same areas.

In further attempts to achieve a higher performance memory cell, the cell shown in FIG. 2 has been devised. The cell of FIG. 2 is known as a complementary transistor switch (CTS) memory cell in which PNP and NPN devices simultaneously drive and act as a load for one another. The PNP transistor 30 will drive NPN transistors 34 and 36, and these transistors 34 and 36 will also act as a load for the transistor 30 through Schottky barrier diode (SBD) 42. Similarly, the transistor 32 will drive transistors 38 and 40 which, in turn, will act as a load for the transistor 32 through the SBD 44. Since the levels within the cell are established entirely by junction voltages rather than linear IR drops, the cell will operate satisfactorily at low current levels, and the use of SBD's 42 and 44 for "on-off" level definition has the further benefit of preventing saturation. Also, the use of a PNP to drive the base of an NPN transistor results in minimal frequency requirements for the PNP and encourages the use of a lateral PNP/vertical NPN as an integrated device.

In the typical operation of the cell of FIG. 2, a "0" is defined by the conduction of transistors 30 and 36, which also establish internal bias such that transistors 32 and 38 are substantially non-conducting and define a "1". Assuming such a memory state, i.e. transistors 30 and 36 conducting, application of a word select signal will result in conduction of this signal to the base of transistor 36 through transistor 30, thus increasing the conduction of the left side of the cell. This high potential at the base of transistor 36 will also be supplied to the base of PNP transistor 32, thus further decreasing the conduction of the right side of the cell. Reading is accomplished by differentially sensing the diodes 42 and 44 with transistors 48 and 50, i.e. if the left side of the cell is conducting, the potential at the base of PNP transistor 30 will be low, thus resulting in non-conduction of NPN transistor 48, while the relatively higher potential at the base of PNP transistor 32 will result in conduction of NPN transistor 50.

In order to change the state of the cell, the off side, or non-conducting side, of the cell is caused to conduct by the application of a negative pulse to the emitter of transistor 40. This will cause conduction of transistor 40 and a consequent lowering of the base potentials of PNP transistor 32 and NPN transistor 36, thereby causing the right-side to conduct while the left-side becomes non-conducting.

Further details of the CTS memory cell can be had by referring to "Complementary Transistor Switch Memory Cell", by J. A. Dorler et al., IBM Technical Disclosure Bulletin, Vol. 16, No. 12, May 1974, pages 3931–3932, and "Lateral PNP Design For Memory Cell", by J. A. Dorler et al., IBM Technical Disclosure Bulletin, Vol. 17, No. 6, Nov. 1974, pages 1619–1620.

A problem with the cell structure of FIG. 2 is that, since the reading of the cell is accomplished by differentially sensing the diodes 42 and 44, and since the potentials across these diodes define a very delicate imbalance in the cell, additional transistors 48 and 50 are required as buffers to connect the cell to the bit lines. Further, in conventional fabrication techniques, npn junction transistors are fabricated vertically, i.e., with a buried collector or subcollector, and pnp transistors are then fabricated horizontally with the n-type subcollector region serving as an npn collector and pnp base. This permits pnp-npn transistor combinations to be fabricated in a merged structure which decreases the size requirements for each cell. Transistors 48 and 50, however, have their collectors typically coupled to a voltage source and, since none of the collectors of transistors 34–40 are coupled to the same source, transistors 48 and 50 will require a separate isolation region. This results in an undesirable increase in the layout area required for each cell.

SUMMARY OF THE INVENTION

It is an object of this invention to improve the switching speed of the above-described memory cells while simultaneously decreasing their size and power requirements.

Briefly, this is achieved according to the present invention by providing memory cells comprising cross-coupled PNP flip-flop transistors with NPN transistor loads, so that switching time is determined by NPN rather than PNP transistors. Since the NPN transistor is a higher performance device, faster switching speeds can be achieved. In one embodiment, the bit lines are directly coupled to the emitters of the flip-flop transistors and the cell is preferably constructed in the form of two beds with each bed containing a lateral PNP flip-flop transistor and vertical NPN load transistor as a merged structure. In a second embodiment, the above-described CTS memory cell is improved by the elimination of transistors 48 and 50 and by using the same transistors and bit lines to perform both the read and write operations. Not only is the cell size decreased by the elimination of unnecessary intermediate transistors 48 and 50, but cell access time is improved by the design of a new read/write circuit configuration which provides a high ratio of selected to unselected cell current.

DETAILED DESCRIPTION OF THE INVENTION

Figure 3:
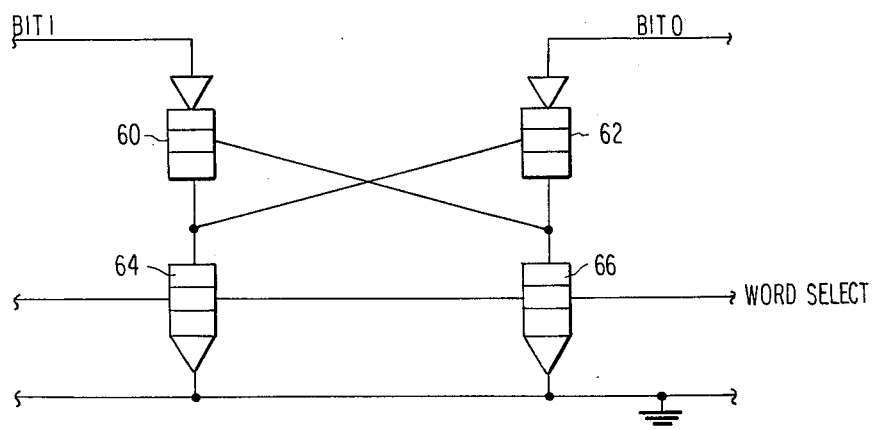
FIG. 3 is a schematic diagram of a first embodiment of a memory cell according to the present invention.

Turning now to FIG. 3, a first memory cell according to the present invention is illustrated in schematic form. The cell comprises a pair of cross-coupled PNP transistors 60 and 62 and a pair of NPN load transistors 64 and 66. The time required to read the contents of the cell will be primarily dependent on the rate at which NPN transistors 64 and 66 can be raised from a low level of current conduction to a high level of current conduction. This is in contrast to the cell of FIG. 1 in which the load transistors are PNP transistors. Since NPN transistors are of higher performance than PNP transistors, the cell according to the present invention will exhibit a faster read time.

The use of cross-coupled PNP transistors together with NPN load transistors is shown in U.S. Pat. No. 3,535,699 to Gaensslen et al., but in the Gaensslen et al device the transistors are all insulated gate field effect transistors, and the bit lines are coupled to the sources of the load transistors. The cell according to the present invention utilizes bipolar load transistors having substantially equal current, and the bit lines are coupled directly to the emitters of the cross-coupled transistors, thus realizing a faster read time.

Figure 1:
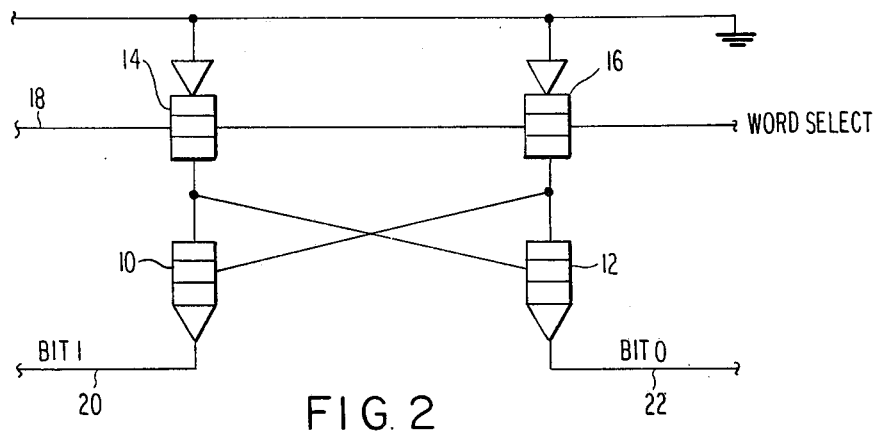
FIG. 1 is a brief schematic diagram of a known TGPL memory cell, already described above.
Figure 4:
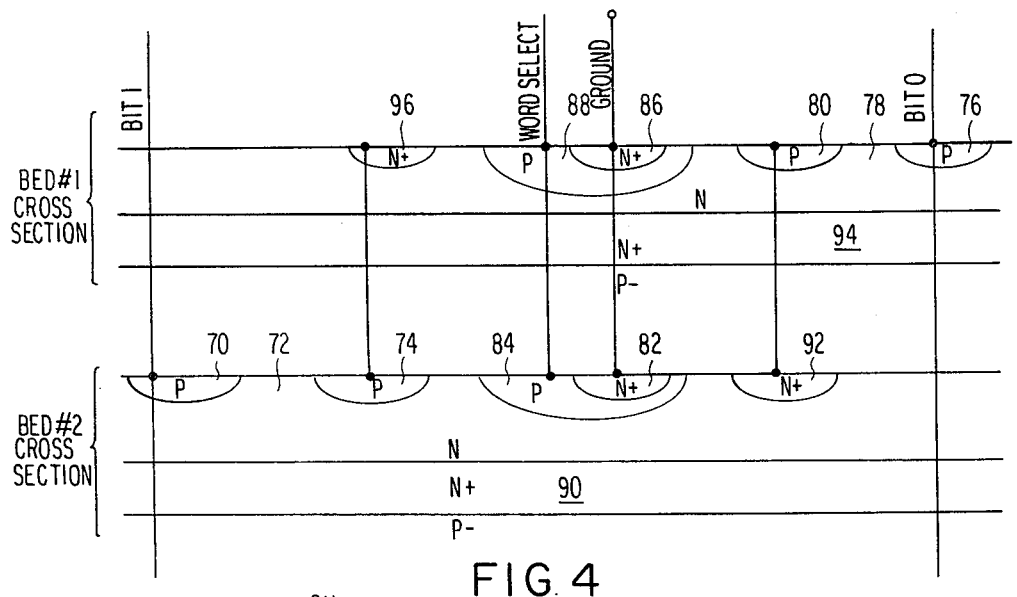
FIG. 4 is a sectional view of the physical semiconductor structure of the cell shown in FIG. 3.

A further feature of the cell circuitry of FIG. 3 which is a distinct advantage over the TGPL cell of FIG. 1 or the IGFET cell of U.S. Pat. No. 3,535,699 is that it lends itself to a very compact merged semiconductor structure. Silicon is typically used in the fabrication of transistors, and the solubility constants of dopants in silicon are amenable to vertical fabrication of npn devices and lateral fabrication of pnp devices, as discussed above. Thus, in FIG. 1, NPN transistors 10 and 12 will be fabricated as vertical transistors with buried collectors, and PNP transistors 14 and 16 will be formed as lateral transistors. However, since the collectors of transistors 10 and 12 are not coupled to the bases of transistors 14 and 16, no merged structure is possible. Similarly, no compact merged structure is possible with the IGFET cell of U.S. Pat. No. 3,535,699. As shown in FIG. 4, however, the cell according to the present invention can be constructed in two separate beds with each bed containing one lateral PNP and one vertical NPN transistor in a merged structure.

In FIG. 4, P-region 70 comprises the emitter of lateral PNP transistor 60 formed by regions 70, 72 and 74. Similarly, P-region 76 comprises the emitter of lateral PNP transistor 62 formed by regions 76, 78 and 80. Semiconductor regions 82, 84 and 72 comprise the emitter, base and collector, respectively, of vertical NPN load transistor 66, and semiconductor regions 86, 88 and 78 comprise the emitter, base and collector, respectively, of vertical NPN load transistor 64. The different portions of the N-region 72 which constitute the base of transistor 60 and collector of transistor 66 are coupled together by N+ region 90 and are connected through N+-region 92 to the collector 80 of transistor 62. Similarly, the different portions of the N-region 78 which constitute the base of transistor 62 and collector of transistor 64 are coupled together by N+-region 94 and are connected through N+-region 96 to the collector 74 of transistor 60. The fabrication of the memory cell in only two beds results in a smaller cell size than either the TGPL memory cell or the memory cell of U.S. Pat. No. 3,535,699, while simultaneously achieving improved performance.

Figure 5:
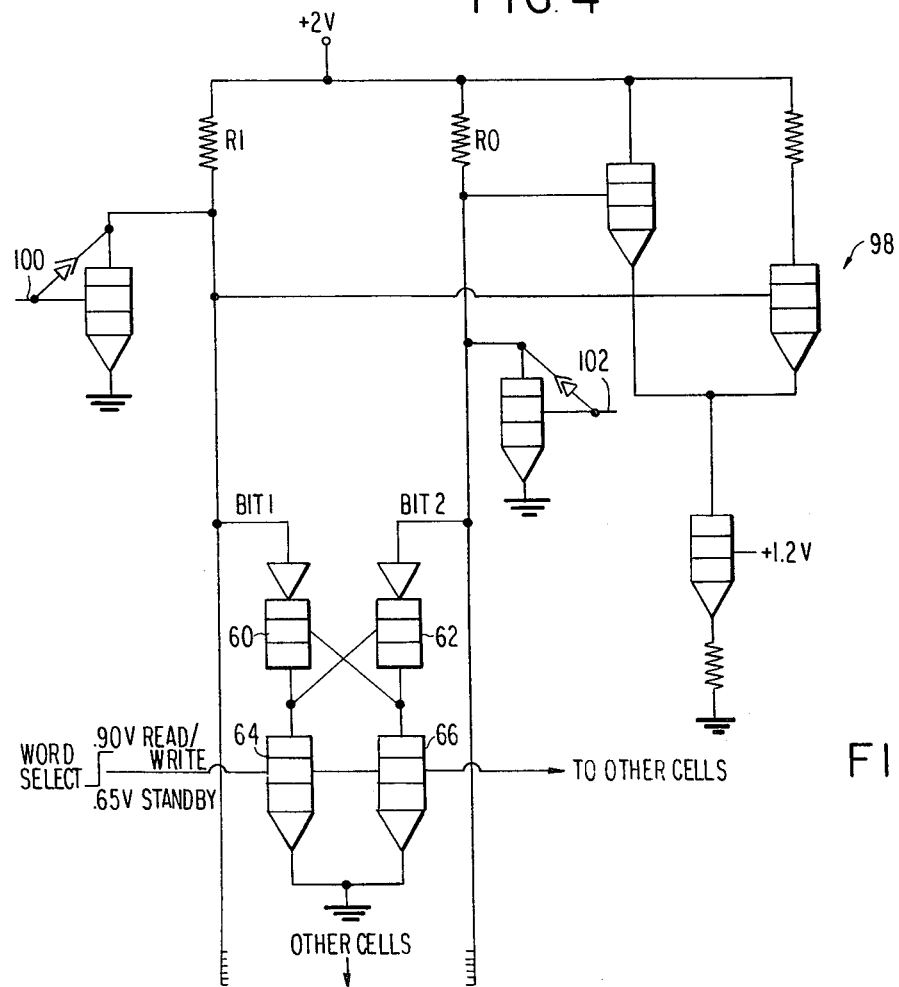
FIG. 5 is a schematic diagram of read/write circuitry for operating the cell of FIG. 3.

FIG. 5 illustrates the cell of FIG. 3 with additional circuitry for describing the standby, read and write operations of the memory cell. In the standby condition, the bit lines are both maintained at a substantially high level (2 volts) by resistors R0 and R1. The word select line is maintained at a low level of approximately 0.65 volts. Small substantially equal currents of approximately 0.1 microamp will flow in each of transistors 64 and 66. Assuming transistor 60 is on and transistor 62 is off, the current through transistor 64 will comprise the collector current of transistor 60 and the current through transistor 66 will comprise the base current of transistor 60. The emitter current of transistor 60 will be approximately 0.2 microamps. The collector of transistor 60 will be in the range of 1.7 to 1.9 volts, and the collector of transistor 62 will be in the range of approximately 1.3 to 1.1 volts.

In order to read the contents of the memory cell, the word select line is raised to a high level of 0.9 volts, thereby increasing the currents flowing in transistors 64 and 66 to approximately 0.1 mA. The emitter current of transistor 60 will increase to approximately 0.2 mA, thereby creating a greater voltage drop across resistor R1 than across resistor R0. The difference in bit line voltages is sensed by a differential amplifier generally designated by reference numeral 98.

In order to change the content of the memory cell, the word select line is raised to 0.9 volts in the same manner as in the read operation. A pulse is then applied to line 100 to lower the potential of the bit line 99 to approximately 0.5 volts, thus reverse biasing the emitter-base junction of transistor 60. The collector of transistor 60 will be pulled down by the 0.1 mA collector current of transistor 64 until transistor 62 is turned on. This, in turn, will raise the collector voltage of transistor 62 to about 1.8 volts and turn off transistor 60. The pulse on line 100 is then terminated to return the voltage on the bit line 99 to its high level, leaving the cell is a quiescent state with transistor 62 on and transistor 60 off. Applying a similar write pulse to line 102 will write a complementary value into the cell.

During the above-described write pulse interval, the emitter-base junctions of transistors 60 in the unselected cells will also be reverse biased, but the potentials at the collectors of transistors 60 in the unselected cells will not fall to change the state of the cell since the low current level of approximately 0.1 microamp flowing through transistors 64 and 66 in the unselected cells will not be sufficient to significantly discharge the collectors of transistors 64 and 66 during the short write pulse interval.

As will be apparent from the above description, the cell of FIG. 3 is advantageous in that its access time is dependent on the turn-on time of higher performance NPN transistors 64 and 66 rather than PNP transistors 14 on 16, and also in that it can be fabricated in a smaller area due to the merged structure which is possible as shown in FIG. 4.

Figure 6:
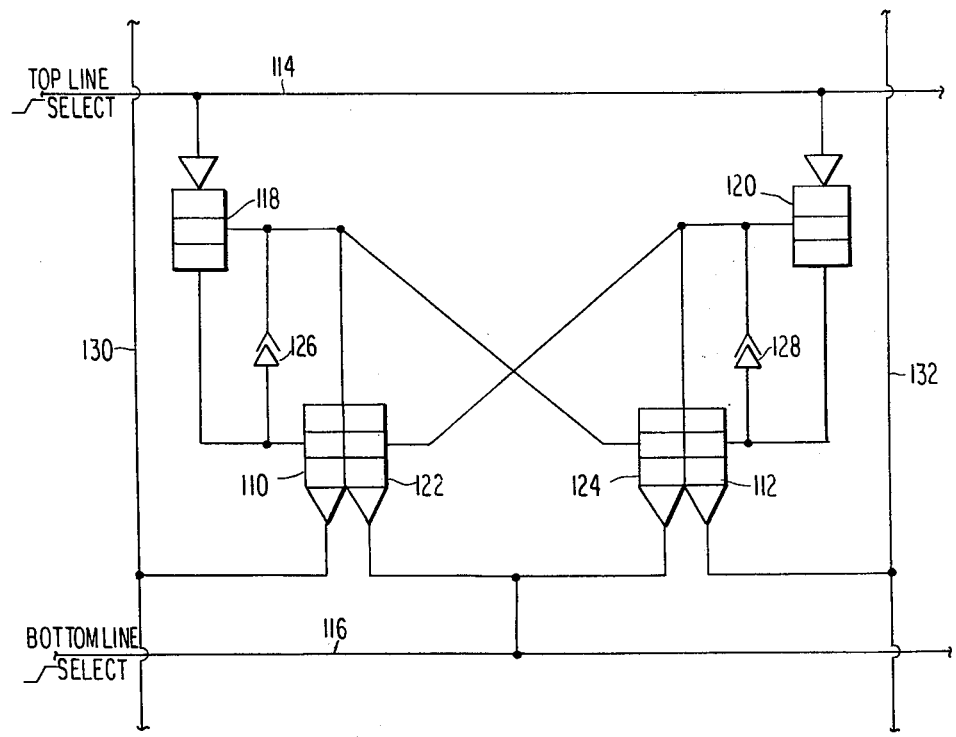
FIG. 6 is a schematic diagram of a second embodiment of a memory cell according to the present invention.

Turning now to FIG. 6, an improved CTS memory cell is shown, which will be hereinafter referred to as the HARPNP cell. The cell is similar to that shown in FIG. 2 except that the transistors 48 and 50 used to couple the cell output to the bit lines have been eliminated, this function being instead served by transistors 110 and 112. Also, the HARPNP cell utilizes top and bottom select lines 114 and 116, respectively in contrast to the single word select line 46 shown in FIG. 2. Otherwise, the transistors 110, 112 and 118-124 are connected in substantially the same manner as the transistors 30-44 of FIG. 2.

The operation of the HARPNP cell is as follows.

During standby conditions, the top and bottom lines 114 and 116 are both at a low potential and the potentials on bit lines 130 and 132 are somewhat higher so that the emitter-base junctions of transistors 110 and 112 are not forward biased. If it is assumed that transistor 122 is ON, then transistor 118 will be ON and transistors 120 and 124 will be OFF. The difference in the base potentials of the transistors 122 and 124 is determined by the forward voltage of either one of the SBD's 126 and 128 and, since the forward voltage of the diodes only varies approximately 60 millivolts per decade of current, the difference in potential between the bases of transistors 122 and 124 is relatively constant over a wide range of current. Accordingly, a given memory state can be maintained over a wide current range, with the lower limit being determined by leakage current.

In order to read the contents of the HARPNP cell, the top and bottom lines 114 and 116 are both raised to a higher potential by a select signal. Since the transistor 118 is conducting, the emitter-base junction of NPN transistor 110 will become forward biased and the potential of the left bit line 130 will be raised. Further, since the transistor 118 is conducting, the base potential of transistor 120 will be increased to ensure that the transistor 112 remains OFF and the right bit line 132 remains at a low potential. The potential dfference between bit lines 130 and 132 can be sensed by a differential sense amplifier.

The bit line current supplied by the emitter of transistor 110 results in an increase in the collector current of that transistor, thus supplying increased base current to the transistor 118 which, in turn, provides a further increase in the current supplied to the base of transistor 110 to support the bit line current. With such a configuration, a relatively large bit line current can be supported without disturbing the stored data, and it is not necessary to utilize additional transistors such as 48 and 50 in FIG. 2 in order to couple the cell to the bit lines.

In order to write into the cell, the top and bottom lines 114 and 116 are raised to a high potential as in the above-described read operation. The right-hand bit line 132 is then lowered to forward bias the emitter-base junction of transistor 112. This will pull down the collector voltage of transistor 112 which, in turn, will simultaneously turn off transistor 122 and turn on transistor 120. When transistor 120 turns on, its collector current will increase the potential at the base of transistor 112, until SBD 128 becomes forward biased. This increase in the potential of the collector of transistor 120 will increase the base potential of transistor 124 so that it will conduct while the transistor 122 is non-conducting, and the potential on the right bit line 132 will be higher than that of the left bit line 130. The write cycle is terminated by returning the top and bottom lines to a low potential, thus turning off the emitter-base junction of transistor 112 while leaving transistor 124 in conduction.

Advantages of the cell shown in FIG. 6 are that it can be used at low standby current of less than 1 microamp and exhibits high noise immunity because the potential differences within the cell are determined by the SBD forward voltage.

Figure 7:
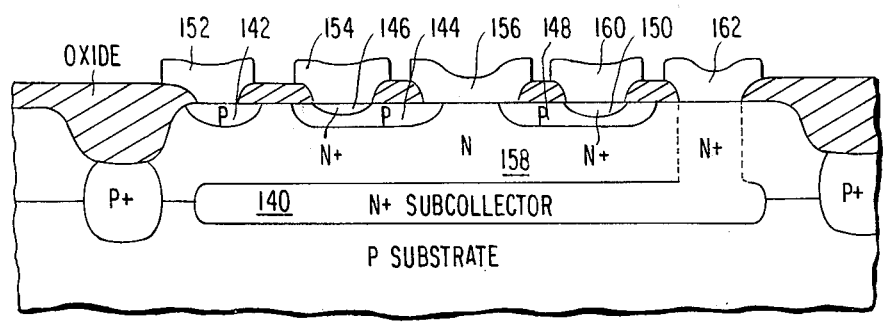
FIG. 7 is a partial sectional view of the physical semiconductor structure of one side of the memory cell of FIG. 6.

An additional and very important advantage of the cell of FIG. 6 is that all of the components on one side of the cell can be easily merged into a single isolation region so that the cell can be fabricated in two compact beds as is the case with the cell configuration of FIGS. 3 and 4. FIG. 7 is a sectional view of one of the beds in which all three transistors on one side of the cell are fabricated in a single merged structure. The N+-subcollector region 140 serves as the collectors of vertical npn transistors 122 and 110 and also serves as the base of lateral pnp transistor 118. P-region 142 forms the emitter of transistor 118 while P-region 144 forms the collector of said transistor 118 while also serving as the base of transistor 110. N+-region 146 forms the emitter of transistor 110, P-region 148 forms the base of transistor 122, and N+-region 150 forms the emitter of transistor 122. Metal contact 152 will connect the emitter of transistor 118 to the top line and to the emitter of the corresponding transistor 120 in a second isolation region (not shown), metal contact 154 will connect the emitter of transistor 110 to the left bit line 130, and metal contact 156 connects the base regions of transistors 110 and 122. Note also that a Schottky barrier diode between the bases of transistors 110 and 122 and the common collector of those transistors is inherent at the metal-semiconductor interface between metal contact 156 and the N-region 158. Metal contact 160 serves to connect the emitter of transistor 122 to the emitter of corresponding transistor 124 in a second isolation region and also to the bottom line 116, and metal contact 162 is the common contact point for the collectors of transistor 110 and 122, base of transistor 118 and cathode of diode 126, and will be connected to the bases of transistors 112 and 124 in the second bed. The transistor 48 of FIG. 2, which could not share the common subcollector 140 and could not easily be merged into the structure of FIG. 6, is unnecessary for the cell structure according to the present invention, thus resulting in a smaller cell area as well as a faster response time.

Figure 2:
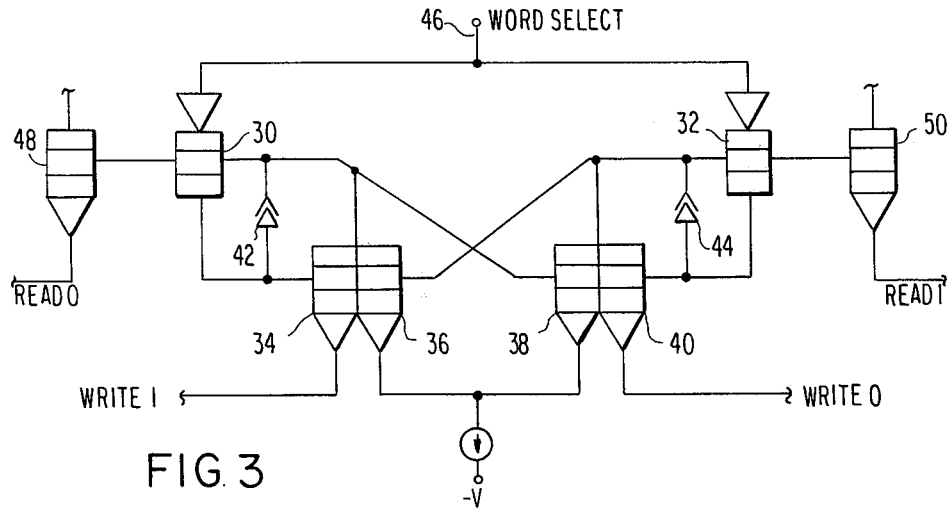
FIG. 2 is a schematic diagram of a known CTS memory cell, already described above.

It should also be noted that in the cell structure of FIG. 2 the transistors 48 and 50 were used to provide sufficient bit line currents while protecting the memory contents, whereas the coupling of the emitters of transistors 110 and 112 to the bit lines in the cell circuitry according to the present invention results in relatively large bit line current capabilities, and consequent shortened access times, without the necessity of these additional transistors 48 and 50 which are difficult to combine in a merged structure.

Figure 8:
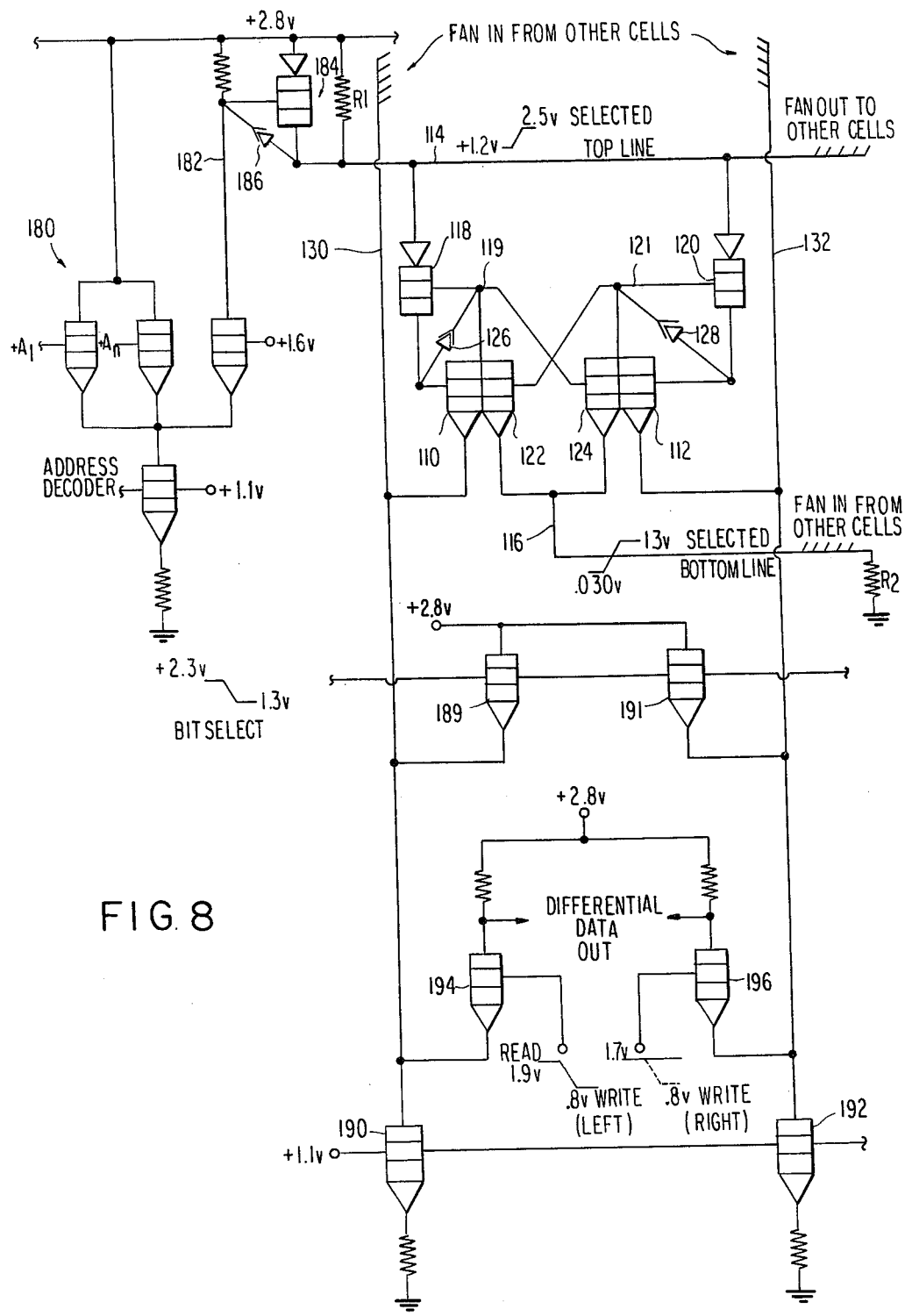
FIG. 8 is a schematic diagram of read/write circuitry for operating the memory cell of FIG. 6.

FIG. 8 illustrates circuitry for implementing the read/write operations in the cell of FIG. 6, and the operation of the cell in conjunction with the circuitry of FIG. 8 will now be described. The following description contemplates a plurality of 80 cells being connected between each top and bottom line. The description also contemplates, for reasons which will become more apparent below, that the values resistors R1 and R2 will be approximately 20kΩ and 0.3kΩ, respectively.

In a quiescent or standby state, transistor 184 will be off and the top line potential will be approximately 1.2 v. Assuming transistor 122 is ON, as in the above-described example, the potential of node 119 will be 0.4 v, since the voltage $V_{BE}$ required to forward bias a base-emitter junction is typically 0.8 v. Since Schottky diode 126 has a forward bias voltage $V_{FSBD}$ of approximately 0.4 v, the potential of node 121 will be 0.8 v, and the bottom line potential will be on the order of 0.030 v.

During this quiescent state, the transistors 189 and 191 are in conduction due to a 2.3 v potential at their bases, thus maintaining bit lines 130 and 132 at approximately 1.5 v. This will ensure that the emitter-base junctions of transistors 110 and 112 are reverse biased, since the voltage required to forward bias the base-emitter junction is 0.8 v.

Read/write transistors 194 and 196 each have a 1.9 v read potential applied to their bases, but their emitter-base junctions are reverse-bias due to the 1.5 v potential maintained on the bit lines by transistors 189 and 191.

Transistors 190 and 192 draw a constant collector current of approximately 0.5 mA from bit lines 130 and 132 regardless of the select potentials or data in each cell.

In order to read the data from the cell, a well-known address decoder generally designated by reference numeral 180 lowers the potential on line 182, thus forward biasing the transistor 184 and diode 186 and raising the potential of the top line 114 to approximately 2.5 v. This will raise the potentials of nodes 119 and 121 to 1.7 v and 2.1 v, respectively. The 2.1 v potential at the base of transistor 122 will raise the potential of the bottom line to 1.3 v. In this state, the 1.5 v potential on lines 130 and 132 prevents transistors 110, 112, 194 and 196 from becoming forward biased.

If a well-known address decoder similar to 180 determines that the particular cell shown in FIG. 8 is to be accessed, the bit select potential at the bases of transistors 189 and 191 is lowered to 1.3 v. The potential on bit line 130 will then fall until it reaches a 1.3 v potential which is 0.8 v below the base potential of transistor 110. The potential on bit line 132 will similarly fall until it reaches 1.1 v, which is 0.8 v below the base potential of transistor 196. With transistor 196 conducting and transistor 194 non-conducting, the potentials at their collectors will differ and can be sensed by a well-known differential amplifier.

In order to write into the cell, the above-described read operations performed and the only additional necessary step is to decrease the potential at the base of the appropriate read/write transistor, e.g. transistor 196. If the base potential of transistor 196 is lowered to 0.8 v, the potential on bit line 132 will be permitted to fall to 0.9 v, which is 0.8 v below the base potential of transistor 112. This will forward bias the emitter-base junction of transistor 112, pulling down the base potentials of transistors 120 and 122. As the conduction of transistor 122 decreases, the base potentials of transistors 118 and 124 will rise until a steady state is achieved with nodes 119 and 121 having potentials of approximately 2.1 and 1.7 v, respectively, which is the reverse of the initial condition described above. Thus, the potential on bit line 130 will be maintained at 1.1 v by transistor 194 and the potential on bit line 132 will be maintained at approximately 1.3 v by transistor 112. When the potential at the base of transistor 196 is again raised to 1.9 v, transistor 194 will be on and transistor 196 off, so that the opposite data state is now indicated.

After the read or write operations described above, the cycle is ended by returning the cell to its standby state. The bit select potential at the bases of transistors 189 and 191 is returned to its high 2.3 v level, and the potential on line 182 is returned to its high level, thereby turning off transistor 184.

In order to obtain a fast cycle time, it is necessary to raise the current to the cell as quickly as possible. Accordingly, it is desirable to have a high ratio of selected to unselected current so that, when a selection signal is received, the current flowing through the cell, and consequently the bottom line voltage, will rise very quickly. It is also preferable that, upon deselect, the potential of the bottom line return to its low standby level as quickly as possible. In FIG. 8, when the address decoder 180 detects the address of a particular word in the memory, the potential on line 182 will be lowered, thus forward biasing the PNP transistor 184 and raising the top line voltage to approximately 2.5 volts. This tends to forward bias the junctions of the conducting transistors in the HARPNP cell, so that there is a low impedance between the top and bottom lines. The rise time of the voltage on the bottom line will be primarily dependent of the speed of the PNP top line driver 184 and the speed of the conducting PNP in the HARPNP cell, with the steady state selected current being determined by the resistor R$_2$. In the selected state, assuming that transistor 118 is conducting, the voltage must forward bias three transistors, 184, 118 and 122, and SBD's 126 and 186 are forward biased. With a R$_2$ value of 0.3kΩ, and assuming that 80 cells are connected between the top and bottom lines, the current in the selected state is $$\frac{1}{80} \times \frac{2.8v - (V_{BE} - V_{FSBD}) - (2V_{BE} - V_{FSBD})}{0.3K\Omega} \cong$$

50 microamp

In the unselected state, the transistor 184 and diode 186 are not forward biased, but the current must pass instead through resistor R$_1$. Assuming resistance value of 20kΩ for R$_1$, the unselected current per cell is:

$$\frac{1}{80} \times \frac{2.8v - (2V_{BE} - V_{FSBD})}{20.3K\Omega} \cong 1 \text{ microamp}$$

As is seen from the above, the (R$_1$/R$_2$) value of approximately 66 results in a ratio of the selected to unselected current of approximately 50, thus ensuring that the bottom line voltage will rise very rapidly during the read cycle. This high ratio is also desirable in that the noise immunity is increased on selection. Further, the fall time, i.e., the time required for the bottom line potential to fall back to its low standby potential, is dependent on the level of the bottom line during select and the discharge time constant of the bottom line. The low resistance value of $R_2$ results in a short RC time constant that permits the bottom line to quickly discharge to its low standby level. The capacitance of the RC time constant is determined by the capacitance of the line itself as well as the capacitances of the cells coupled to the bottom line.

What is claimed is:

1. A memory device comprising:
    first and second PNP transistors each having an emitter, base and collector;
    first and second NPN transistors each having an emitter, base and collector, the bases of said first and second NPN transistors being coupled together and to the collector of said first PNP transistor and to the base of said second PNP transistor, the collectors of said first and second NPN transistors being coupled together and to the base of said first PNP transistor;
    third and fourth NPN transistors each having an emitter, base and collector, the bases of said third and fourth NPN transistors being coupled together and to the collector of said second PNP transistor and to the base of said first PNP transistor, and the collectors of said third and fourth NPN transistors being coupled together and to the base of said second PNP transistors;
    first and second Schottky diodes coupled between the collector and base of said first and second PNP transistors, respectively;
    first and second bit lines coupled to the emitters of said first and fourth NPN transistors, respectively;
    a top line connected in common to the emitters of said first and second PNP transistors;
    a bottom line connected in common to the emitters of said second and third NPN transistors;
    driver means for raising the potentials on said top and bottom lines to thereby generate a potential difference between said bit lines in accordance with the data stored in said memory device; and
    means for sensing said potential difference to determine the data stored in said memory device.

2. A memory device as defined in claim 1, wherein said first PNP transistor, first Schottky diode and first and second NPN transistors are all formed in a first semiconductor isolation region, and wherein said second PNP transistor, second Schottky diode and third and fourth NPN transistors are all formed in a second semiconductor isolation region.

3. A memory device as defined in claim 2, wherein said first semiconductor isolation region comprises:
    a first N-region (158) forming the collectors of said first and second NPN transistors and the base of said first PNP transistor;
    a first P-region (142) within said first N-region and forming the emitter of said first PNP transistor;
    a second P-region (144) within said first N-region and forming the collector of said first PNP transistor and base of said first NPN transistor;
    a first N+-region (146) within said second P-region and forming the emitter of said first NPN transistor;
    a third P-region (148) within said first N-region and forming the base of said second NPN transistor;
    a second N+-region (150) within said third P-region and forming the emitter of said second NPN transistor; and
    metal contact means (156) in surface contact with said second and third P-regions and said first N-region, said first Schottky diode being formed at the contacting surfaces of said metal contact means and first N-region.

4. A memory device as defined in claim 3, further comprising an N+ subcollector region (140) underlying said N-region, and second metal contact means (162) in contact with said N+ subcollector region and serving as a common contact point for the collectors of said first and second NPN transistors and base of said first PNP transistor.

5. A memory device as defined in claim 4, further comprising:
    first (194) and second (196) NPN read/write transistors each having an emitter, base and collector, the emitters of said first and second read/write transistors being coupled to said first and second bit lines, respectively;
    means for applying a read potential to the bases of said first and second read/write transistors, said read potential having a value between the potentials of said second and third NPN transistor bases when the potentials on said top and bottom lines are raised, whereby one of said read/write transistors will conduct in accordance with the data stored in said memory device.

6. A memory device as defined in claim 5, further comprising means for applying a write potential to the base of one of said read/write transistors whereby the potential is lowered on the bit line coupled to said one read/write transistor, thereby forward biasing the emitter-base junction of the first or fourth NPN transistor having its emitter coupled to said bit line.

7. A memory device as defined in claim 1, wherein said driver means comprises:
    a source of voltage;
    a driver transistor having its emitter-collector path coupled between said voltage source and said top line;
    a first resistor having a resistance value R1 coupled in parallel with said driver transistor between said voltage source and said top line; and
    a second resistor having a resistance value R2 coupled between said bottom line and ground.

8. A memory as defined in claim 7, wherein the value (R1/R2) is approximately 66.

9. A memory device as defined in claim 7, wherein said driver transistor comprises a PNP transistor having its emitter coupled to said voltage source and collector coupled to said top line, said driver means further comprising a third Schottky diode coupled between the collector and base of said driver transistor.

* * * * *